(12) United States Patent
Pipho

(10) Patent No.: US 8,226,443 B2
(45) Date of Patent: Jul. 24, 2012

(54) INTERCONNECT DETECTION SYSTEM

(75) Inventor: David A. Pipho, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1102 days.

(21) Appl. No.: 11/788,461

(22) Filed: Apr. 20, 2007

(65) Prior Publication Data
US 2008/0261433 A1 Oct. 23, 2008

(51) Int. Cl.
H01R 24/00 (2011.01)
(52) U.S. Cl. .................................................... 439/630
(58) Field of Classification Search ............... 439/630, 439/108, 159
See application file for complete search history.

(56) References Cited

U.S. PATENT DOCUMENTS

| | | | |
|---|---|---|---|
| 3,973,919 A | 8/1976 | Simon | |
| 4,871,323 A | 10/1989 | Ohsumi | |
| 4,900,267 A | 2/1990 | Nagasaka et al. | |
| 5,021,003 A | 6/1991 | Ohtaka et al. | |
| 5,034,727 A | 7/1991 | Muraoka | |
| 5,041,017 A | 8/1991 | Nakazato et al. | |
| 5,055,058 A | 10/1991 | Nagasaka et al. | |
| 5,060,372 A | 10/1991 | Capp et al. | |
| 5,127,848 A | 7/1992 | Taguchi | |
| 5,131,865 A | 7/1992 | Taguchi et al. | |
| 5,174,776 A | 12/1992 | Ohtaka et al. | |
| 5,417,586 A | 5/1995 | Endo et al. | |
| 5,613,872 A | 3/1997 | Fukuda et al. | |
| 5,637,009 A | 6/1997 | Tsuji et al. | |
| 5,667,403 A | 9/1997 | Fukuda et al. | |
| 6,126,480 A | 10/2000 | Kawase et al. | |
| 6,280,221 B1 | 8/2001 | Fukase et al. | |
| 6,816,386 B2 | 11/2004 | Oguchi et al. | |
| 6,899,557 B2 | 5/2005 | Hirata | |
| 7,137,836 B2 | 11/2006 | Lu et al. | |
| 7,150,654 B2 * | 12/2006 | Inaba | 439/630 |
| 7,172,463 B2 * | 2/2007 | Inaba | 439/630 |
| 7,281,934 B2 * | 10/2007 | Aoki | 439/159 |
| 2002/0119695 A1 | 8/2002 | Kozono et al. | |
| 2004/0209506 A1 | 10/2004 | Kawahata et al. | |
| 2004/0266267 A1 * | 12/2004 | Inaba | 439/630 |
| 2005/0037659 A1 | 2/2005 | Wu | |

FOREIGN PATENT DOCUMENTS

| | | |
|---|---|---|
| EP | 0 732 775 A2 | 9/1996 |
| JP | 62-177783 | 8/1987 |
| JP | 06-155974 | 6/1994 |
| JP | 10-177080 | 6/1998 |
| JP | 11-066246 | 5/1999 |
| JP | 13-060474 | 5/2001 |

* cited by examiner

*Primary Examiner* — Tulsidas C Patel
*Assistant Examiner* — Phuong Nguyen

(57) ABSTRACT

An interconnect detection system comprises a first connector member having a set of laterally spaced-apart contacts for communicatively engaging a corresponding set of contacts of a second connector member, at least two of the contacts of the first connector member offset a predetermined distance in a non-lateral direction away from at least two respective contacts of the second connector member. The system also comprises an indicator configured to provide an indication of contact between the at least two offset contacts of the first connector member with respective contacts of the second connector member to verify a valid interconnect between the first and second connector members.

19 Claims, 4 Drawing Sheets

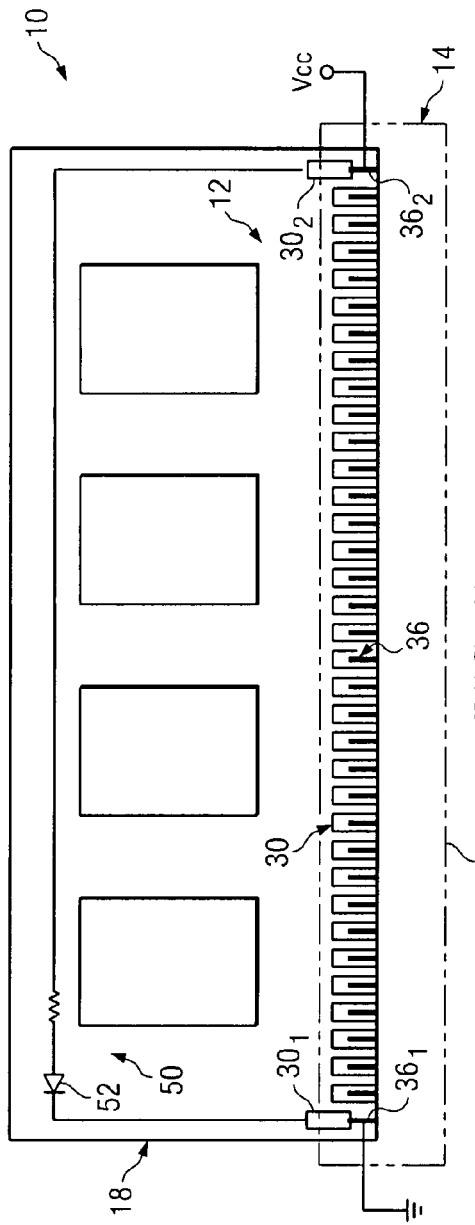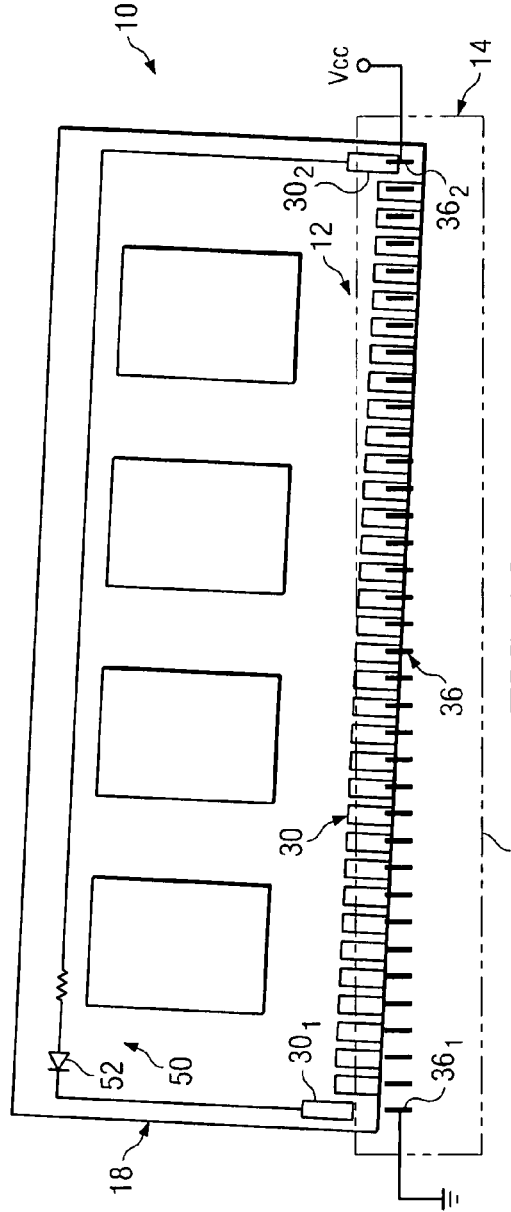

INTERCONNECT DETECTION SYSTEM

BACKGROUND

In electronic devices, components are often coupled together via a type of connector. For example, such connectors generally comprise a set of conductive contacts that engage corresponding conductive contacts of another component when the two components/connectors are brought into engagement with each other (e.g., a memory card or module inserted into a connector disposed on a printed circuit board). However, if the components/connectors are not properly seated, intermittent and/or a complete disengagement may result. For example, if the components/connectors are not properly seated, shock or vibration during use or even during shipping of the electronic device may cause a disengagement of the components/connectors.

BRIEF DESCRIPTION OF THE DRAWINGS

FIGS. 1A-1C are diagrams illustrating an embodiment of an interconnect detection system.

DETAILED DESCRIPTION OF THE DRAWINGS

Figure 1A:
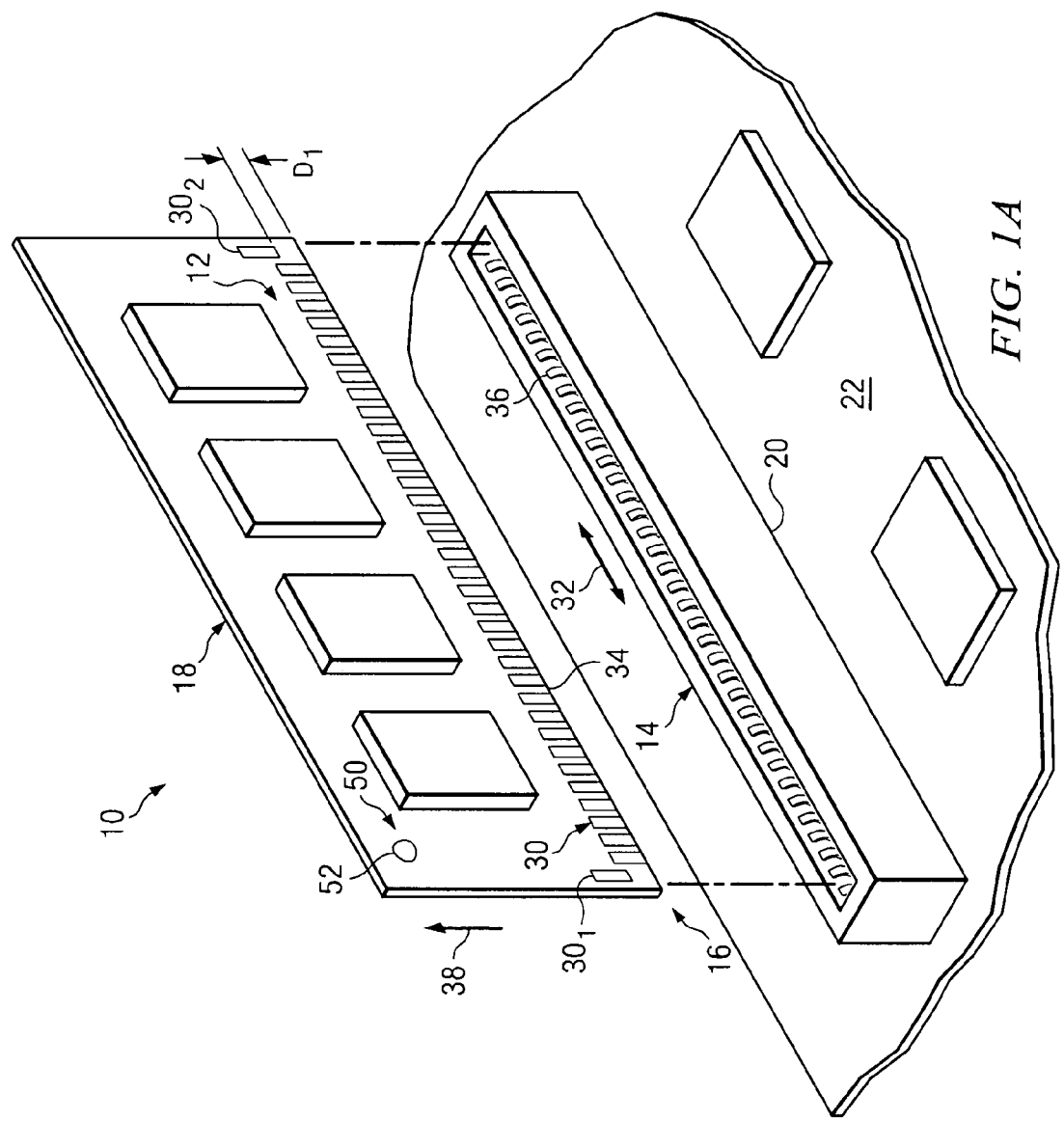

FIGS. 1A-1C are diagrams illustrating an embodiment of an interconnect detection system 10. In the embodiment illustrated in FIGS. 1A-1C, system 10 comprises a connector member 12 configured to communicatively and/or conductively engage a connector member 14. In FIGS. 1A-1C, connector member 12 comprises an edge connector 16 of a memory card or module 18, and connector member 14 comprises a connector element 20 coupled to a printed circuit board (PCB) 22. However, it should be understood that connector members 12 and 14 may be otherwise configured based on the type of components and/or connectors configured to be electrically coupled together.

In the embodiment illustrated in FIGS. 1A-1C, connector member 12 comprises a set of conductive contacts 30 disposed in a spaced-apart relationship to each other and extending along a lateral dimension, indicated by arrow 32, along and/or on an edge 34 of memory module 18 for communicative and/or conductive engagement with a set of conductive contacts 36 of connector member 14. For example, as illustrated in FIGS. 1A-1C, contacts 30 are positioned to align with respective contacts 36 of connector member 14 when memory module 18 is inserted into connector member 14. As illustrated in FIGS. 1A-1C, contacts 36 are disposed in a spaced apart relationship relative to each other and extending along a lateral dimension of connector member 14 corresponding to the lateral dimension 32 of memory module 18 to facilitate conductive engagement of respective and/or aligned contacts 30 and 36.

In the embodiment illustrated in FIGS. 1A-1C, memory module 18 comprises at least two detect contacts $30_1$ and $30_2$ that are disposed in a setback or offset direction by a predetermined distance away from an engagement direction with connector member 14. For example, in the embodiment illustrated in FIGS. 1A-1C, contacts $30_1$ and $30_2$ are set back and/or offset a distance $D_1$ from edge 34 of memory module 18 in a direction indicated by arrow 38 (e.g., a non-lateral dimension or a dimension perpendicular to dimension 32) away from the direction of engagement of memory module 18 with connector element 20. In FIGS. 1A-1C, contacts $30_1$ and $30_2$ are located on opposite ends of connector member 12 and/or on opposite ends of the set of contacts 30, thereby having one or more remaining contacts 30 disposed between contacts $30_1$ and $30_2$. However, it should be understood that $30_1$ and $30_2$ may be otherwise located.

Referring to FIG. 1B and FIG. 1C, contacts $30_1$ and $30_2$ are conductively coupled together through an indicator 50 disposed on memory module 18. In the embodiment illustrated in FIGS. 1A-1C, indicator 50 comprises a light emitting diode 52. However, it should be understood that another type of indicator may be used. Referring to FIG. 1B and FIG. 1C, two detect contacts $36_1$ and $36_2$ are located on connector element 20 to conductively engage respective and/or corresponding contacts $30_1$ and $30_2$ of memory module 18. In FIGS. 1B and 1C, contact $36_2$ is coupled to a power source, indicated by $V_{CC}$ in FIGS. 1B and 1C, and contact $36_1$ is coupled to ground. However, it should be understood that the particular contacts $36_1$ and $36_2$ of connector element 20 coupled to a power source or ground may be reversed. In some embodiments of operation, power $V_{CC}$ and ground are provided through PCB 22 (FIG. 1A). However, it should be understood that contact probes or other devices may be used to conductively engage contacts $36_1$ and $36_2$ to provide power and ground contact.

In operation, if memory module 18 is properly seated in connector element 20, contacts $30_1$ and $30_2$ are located in a position to engage respective contacts $36_1$ and $36_2$ despite the offset condition of contacts $30_1$ and $30_2$. For example, as illustrated in FIG. 1B, memory module 18 is illustrated in a properly seated position relative to connector element 20 such that contacts $36_1$ and $36_2$ are in engagement with respective contacts $30_1$ and $30_2$. In some embodiments, power source $V_{CC}$ is used to illuminate indicator 50, thereby providing a signal indicative of a properly seated memory module 18 within connector element 20. For example, as illustrated in FIG. 1B, in response to a properly seated condition of memory module 18 within connector element 20, engagement of contacts $30_1$ and $30_2$ with respective contacts $36_1$ and $36_2$ closes a circuit formed by power source $V_{CC}$, contacts $30_1$ and $30_2$, contacts $36_1$ and $36_2$, and ground. Thus, in response to establishing a conductive path from power source $V_{CC}$ to ground through contacts $30_1$ and $30_2$ and contacts $36_1$ and $36_2$, light emitting diode 52 is illuminated, thereby indicating a proper interconnect between memory module 18 and connector element 20.

As a further illustration, referring to FIG. 1C, if memory module 18 is improperly seated within connector element 20, one or the other of contacts $30_1$ and $30_2$ will be in a disengaged condition with one of respective contacts $36_1$ and $36_2$. For example, as illustrated in FIG. 1C, memory module 18 is illustrated in an improperly seated condition relative to connector element 20 such that, because of the setback or offset condition of contact $30_1$, contact $30_1$ is in a disengaged condition relative to contact $36_1$. Thus, even though contact $30_2$ may be in engagement with $36_2$, the disengaged condition of contact $30_1$ relative to contact $36_1$ results in an open circuit and a lack of illumination of indicator 50.

Figure 2A:
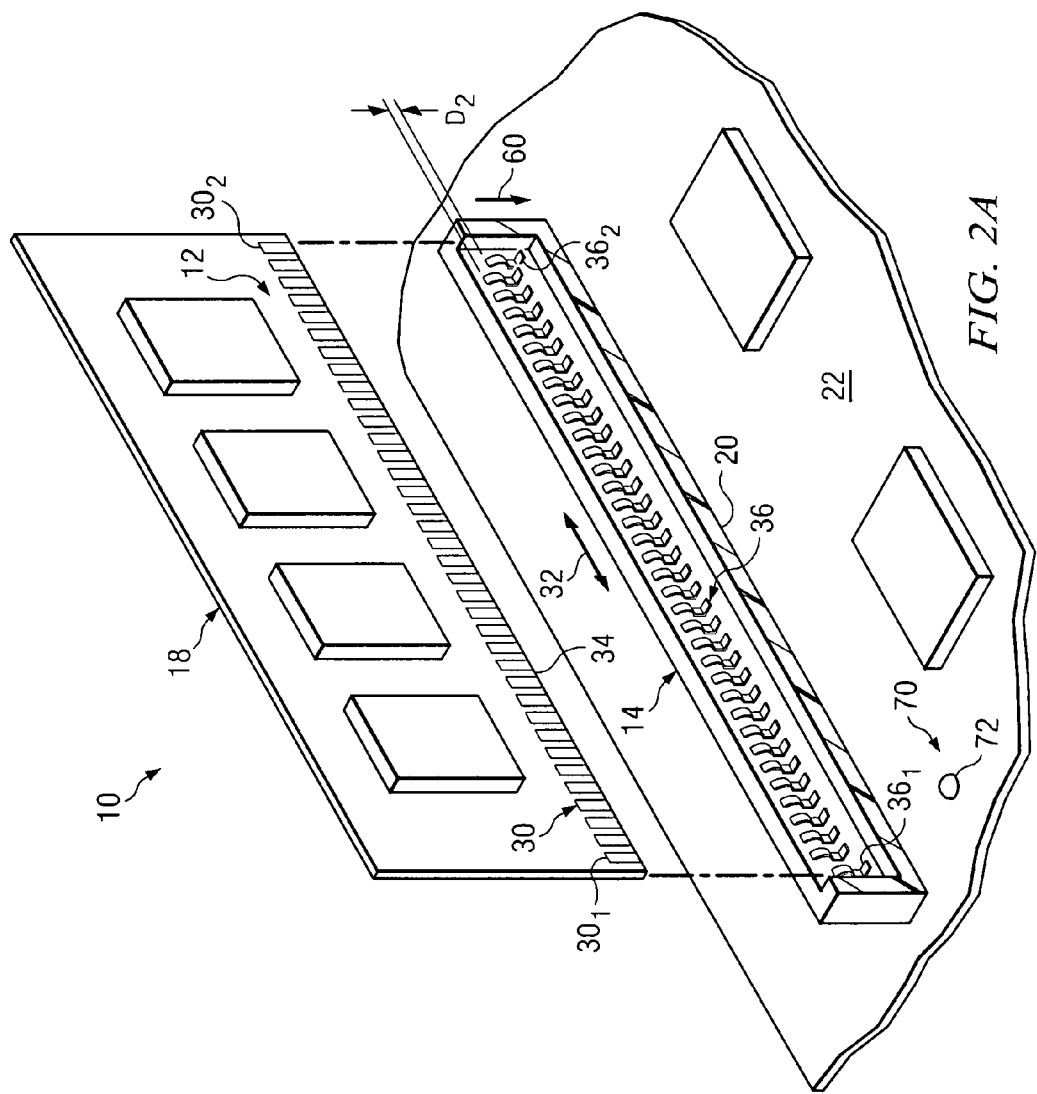
FIGS. 2A-2C are diagrams illustrating another embodiment of an interconnect detection system.
Figure 2B:
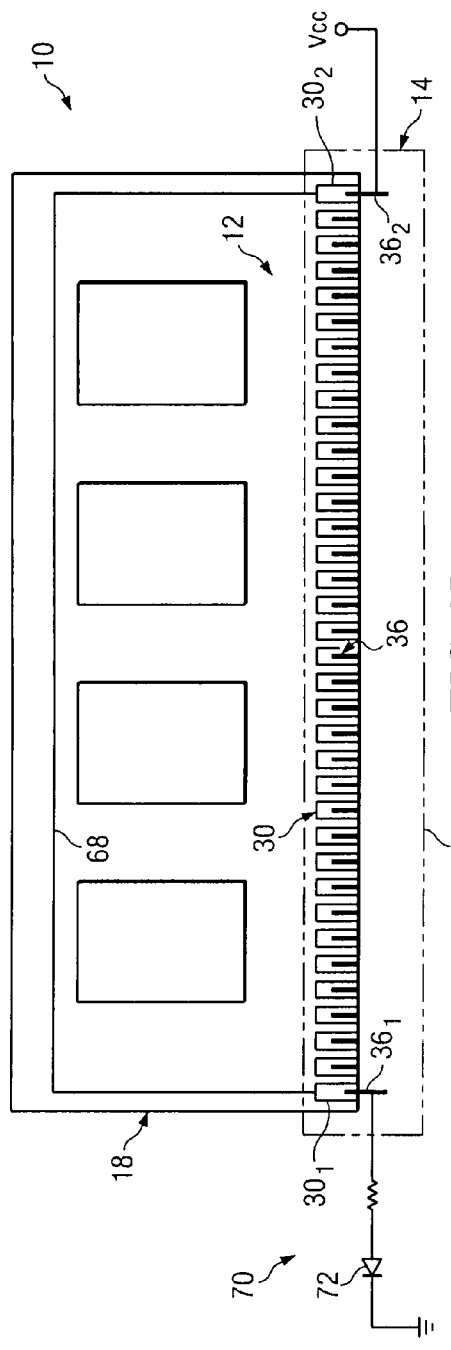
Figure 2C:
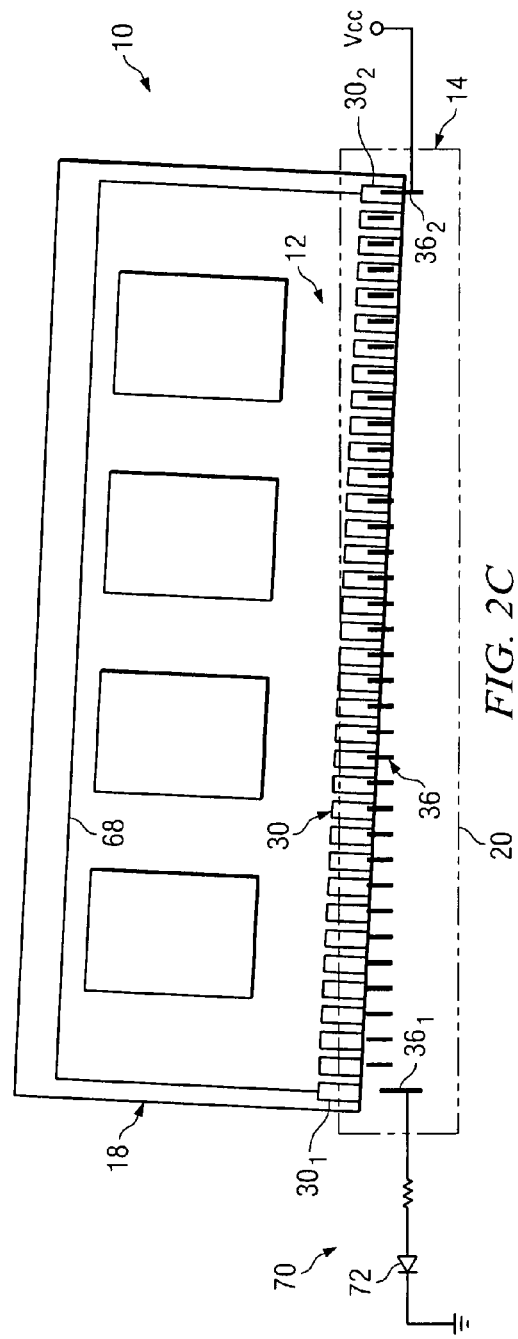

FIGS. 2A-2C are diagrams illustrating another embodiment of interconnection detection system 10. In the embodiment illustrated in FIGS. 1A-1C, contacts $36_1$ and $36_2$ of connector element 20 are disposed in a setback or offset condition relative to remaining contacts 36 of connector element 20. For example, in the embodiment illustrated in FIGS. 2A-2C, contacts $36_1$ and $36_2$ are disposed setback and/or offset a distance $D_2$ from remaining contacts 36 in a direction away from an engagement direction with memory module 18 (e.g., in a non-lateral dimension such as the direction indicated by arrow 60, which is perpendicular to the lateral dimension 32). In the embodiment illustrated in FIGS. 2A-2C, contacts $36_1$ and $36_2$ are located at opposite ends of connector element 20 and/or at opposite ends of the set of contacts $36_1$ thereby resulting in one or more of the remaining contacts 36 disposed between contacts $36_1$ and $36_2$. However, it should be understood that the locations of contacts $36_1$ and $36_2$ in a setback or offset condition may be otherwise located on connector element 20. It should also be understood that locating the setback or offset contacts $36_1$ and $36_2$ of connector element 20 as far apart as possible (the contacts $30_1$ and $30_2$ as well) having other contacts 36 disposed therebetween facilitates a greater likelihood of an indication of whether memory module 18 is properly seated within connector element 20.

Referring to FIGS. 2B and 2C, contacts $30_1$ and $30_2$ that are positioned on memory module 18 to engage respective contacts $36_1$ and $36_2$ are conductively coupled together via a conductive path 68. In FIGS. 2B and 2C, contact $36_2$ is coupled to a power source $V_{CC}$, and contact $36_1$ is connected to ground via an indicator 70, such as a light emitting diode 72 disposed on PCB 22 (FIG. 2A). However, it should be understood that the particular setback or offset contacts $36_1$ and $36_2$ of connector element 20 coupled to a power source or ground may be reversed. In some embodiments of operation, power $V_{CC}$ and ground are provided through PCB 22 (FIG. 1A). However, it should be understood that contact probes or other devices may be used to conductively engage contacts $36_1$ and $36_2$ to provide power and ground contact.

In operation, if memory module 18 is properly seated in connector element 20, contacts $36_1$ and $36_2$ are located in a position to engage respective contacts $30_1$ and $30_2$ despite the offset condition of contacts $36_1$ and $36_2$. For example, as illustrated in FIG. 2B, memory module 18 is illustrated in a properly seated position relative to connector element 20 such that contacts $36_1$ and $36_2$ are in engagement with respective contacts $30_1$ and $30_2$. In some embodiments, power source $V_{CC}$ is used to illuminate indicator 70, thereby providing a signal indicative of a properly seated memory module 18 within connector element 20. For example, as illustrated in FIG. 2B, in response to a properly seated condition of memory module 18 within connector element 20, engagement of contacts $30_1$ and $30_2$ with respective contacts $36_1$ and $36_2$ closes a circuit formed by power source $V_{CC}$, contacts $30_1$ and $30_2$, contacts $36_1$ and $36_2$, and ground. Thus, in response to establishing a conductive path from power source $V_{CC}$ to ground through contacts $30_1$ and $30_2$ and contacts $36_1$ and $36_2$, light emitting diode 72 is illuminated, thereby indicating a proper interconnect between memory module 18 and connector element 20.

As a further illustration, referring to FIG. 2C, if memory module 18 is improperly seated within connector element 20, one or the other of contacts $36_1$ and $36_2$ will be in a disengaged condition with one of respective contacts $30_1$ and $30_2$. For example, as illustrated in FIG. 2C, memory module 18 is illustrated in an improperly seated condition relative to connector element 20 such that, because of the setback or offset condition of contact $36_1$, contact $36_1$ is in a disengaged condition relative to contact $30_1$. Thus, even though contact $30_2$ is in engagement with $36_2$, the disengaged condition of contact $36_1$ relative to contact $30_1$ results in an open circuit and a lack of illumination of indicator 70.

In the embodiments illustrated in FIGS. 1B, 1C, 2B and 2C, contacts $30_1$ and $30_2$ are conductively coupled together on memory module 18 so that a conductive path is established through contacts $30_1$ and $30_2$ in response to a properly seated memory module 18 within connector element 20. However, it should be understood that system 10 may be otherwise configured. For example, in some embodiments, contacts $36_1$ and $36_2$ may be conductively coupled together on connector element 20 such that in response to a properly seated memory module 18 within connector element 20, a conductive path is established through contacts $36_1$ and $36_2$ and contacts $30_1$ and $30_2$. In this embodiment, for example, contact probes or other methods/devices may be used to engage contacts $30_1$ and $30_2$ for power and ground. Thus, it should be understood that a variety of different configurations may be used for system 10 to verify an interconnect between memory module 18 and connector element 20.

Thus, embodiments of system 10 enable a visual indication of a proper seating condition between respective connector members. In the embodiments illustrated in FIGS. 1A-1C and 2A-2C, two contacts $30_1$ and $30_2$ and two contacts $36_1$ and $36_2$ are used to verify the interconnection between memory module 18 and connector element 20; however, it should be understood that other contacts 30 and 36 and/or additional contacts 30 and 36 on memory module 18 and/or connector element 20 may be used.

What is claimed is:

1. An interconnect detection system, comprising:
   a first connector member having a set of laterally spaced-apart contacts for communicatively engaging a corresponding set of contacts of a second connector member, at least two of the contacts of the first connector member offset a predetermined distance in a non-lateral direction away from at least two respective contacts of the second connector member; and
   an indicator configured to provide an indication of contact between the at least two offset contacts of the first connector member with respective contacts of the second connector member to verify a valid interconnect between the first and second connector members.

2. The system of claim 1, wherein the at least two offset contacts are disposed at opposite ends of the set of contacts of the first connector member.

3. The system of claim 1, wherein the at least two offset contacts have at least one non-offset contact disposed therebetween.

4. The system of claim 1, wherein the indicator comprises at least one light emitting diode.

5. The system of claim 1, wherein the indicator is configured to signal a conductive path through the at least two offset contacts and the at least two respective contacts of the second connector member.

6. The system of claim 1, wherein the indicator is disposed on the first connector member.

7. The system of claim 1, wherein the at least two offset contacts are conductively coupled together on the first connector member.

8. The system of claim 7, wherein one of the at least two respective contacts on the second connector member is coupled to a voltage source and another one of the at least two respective contacts of the second connector member is coupled to a ground.

9. An interconnect detection system, comprising:
   a memory module having a set of laterally spaced-apart contacts for communicatively engaging a corresponding set of contacts of a connector member, at least two of the contacts of the memory module offset a predetermined distance in a non-lateral direction away from a direction of engagement with the connector member; and
   an indicator configured to provide an indication of contact between the at least two offset contacts with respective contacts of the connector member to verify a valid interconnect between the memory module and the connector member.

10. The system of claim 9, wherein the indicator is disposed on the memory module.

11. The system of claim 9, wherein the indicator comprises a light emitting diode disposed on the memory module.

12. The system of claim 9, wherein the indicator is configured to provide an indication of a conductive path between the at least two offset contacts and the respective contacts of the connector member.

13. The system of claim 9, wherein the at least two offset contacts are conductively coupled to each other.

14. The system of claim 9, wherein the indicator is configured to provide the indication in response to one of the offset contacts engaging one of the respective contacts of the connector member coupled to a power source and another one of the offset contacts engaging another respective contact of the connector member coupled to a ground.

15. An interconnect detection system, comprising:
a printed circuit board (PCB) having a connector member disposed thereon, the PCB connector member having a set of laterally spaced apart contacts for communicatively engaging a corresponding set of contacts of another connector member, at least two of the contacts of the PCB connector member offset a predetermined distance in a non-lateral direction away from a direction of engagement with the another connector member; and
an indicator configured to signal contact between the at least two offset contacts with respective contacts of the another connector member to verify a valid interconnect between the PCB connector member and the another connector member.

16. The system of claim 15, wherein the indicator is disposed on the PCB.

17. The system of claim 15, wherein the indicator comprises a light emitting diode disposed on the PCB.

18. The system of claim 15, wherein one of the offset contacts is coupled to a power source and another one of the offset contacts is coupled to a ground.

19. The system of claim 15, wherein the indicator is configured to signal a closed circuit between the at least two offset contacts and the respective contacts of the another connector member.

* * * * *